US007425505B2

(12) United States Patent
Clark et al.

(10) Patent No.: US 7,425,505 B2
(45) Date of Patent: Sep. 16, 2008

(54) USE OF SILYATING AGENTS

(75) Inventors: Philip G. Clark, Eden Prairie, MN (US); Kurt Karl Christenson, Minnetonka, MN (US); Brent D. Schwab, Burnsville, MN (US)

(73) Assignee: FSI International, Inc., Chaska, MN (US)

( * ) Notice: Subject to any disclaimer, the term of this patent is extended or adjusted under 35 U.S.C. 154(b) by 0 days.

(21) Appl. No.: 10/894,319

(22) Filed: Jul. 19, 2004

(65) Prior Publication Data

US 2005/0032293 A1 Feb. 10, 2005

Related U.S. Application Data

(60) Provisional application No. 60/489,414, filed on Jul. 23, 2003.

(51) Int. Cl.
*H01L 21/44* (2006.01)
(52) U.S. Cl. ................ 438/689; 438/725; 438/780; 438/787; 257/E21.56
(58) Field of Classification Search ................ 438/689, 438/725, 780, 787
See application file for complete search history.

(56) References Cited

U.S. PATENT DOCUMENTS

| | | | | |
|---|---|---|---|---|
| 5,378,436 A * | 1/1995 | Endoh et al. | ................ | 422/186 |
| 5,429,673 A | 7/1995 | Peterson et al. | ........ | 106/287.11 |
| 5,694,740 A * | 12/1997 | Martin et al. | ................ | 53/431 |
| 5,847,443 A | 12/1998 | Cho et al. | ................ | 257/632 |
| 6,140,252 A | 10/2000 | Cho et al. | ................ | 438/781 |
| 6,348,407 B1 | 2/2002 | Gupta et al. | ................ | 438/637 |
| 6,383,466 B1 | 5/2002 | Domansky et al. | ................ | 423/335 |
| 6,395,651 B1 | 5/2002 | Smith et al. | ................ | 438/787 |
| 6,417,118 B1 | 7/2002 | Hu et al. | ................ | 438/790 |
| 6,495,906 B2 | 12/2002 | Smith et al. | ................ | 257/629 |
| 6,531,755 B1 | 3/2003 | Usami | ................ | 257/520 |
| 6,537,928 B1 | 3/2003 | Matsuki et al. | ................ | 438/788 |
| 6,548,113 B1 | 4/2003 | Birnbaum et al. | ...... | 427/255.11 |
| 6,645,702 B1 * | 11/2003 | Rangarajan et al. | .......... | 430/313 |
| 7,029,826 B2 | 4/2006 | Hacker et al. | | |
| 2001/0034076 A1 | 10/2001 | Martin | ................ | 438/50 |
| 2002/0037371 A1* | 3/2002 | Kumagai et al. | ......... | 427/430.1 |
| 2002/0100419 A1 | 8/2002 | Nagashima | ................ | 118/722 |
| 2002/0123236 A1 | 9/2002 | Tanaka et al. | ................ | 438/758 |
| 2002/0123242 A1 | 9/2002 | Smith et al. | ................ | 438/787 |
| 2003/0008518 A1 | 1/2003 | Chang et al. | ................ | 438/745 |
| 2004/0050406 A1* | 3/2004 | Sehgal | ................ | 134/26 |
| 2004/0157430 A1* | 8/2004 | Mandal | ................ | 438/636 |

OTHER PUBLICATIONS

Patent Abstracts of Japan, Pub. No. 60047419, Pub. date Mar. 14, 1095.
Patent Abstracts of Japan, Pub. No. 03043741, Pub. date Feb. 25, 1991.
"Effective repair to ultra-low-k dielectric material (k~2.0) by hexamethyldisilazane treatment," Mor et al, J. Vac. Sci. Technol. B 20(4), Jul./Aug. 2002, American Vacuum Society.
"A Comparison of Hydrofluoroether and Other Alternative Solvent Cleaning Systems," publication by Jason Kehren, 3M Company, St. Paul, MN.
P-T Liu, T.C. Chang, Y.S. Mor, C.W. Chen, T.M. Tsai, C.J. Chu, F.M. Pan and S.M. Sze, "Effective Strategy for Porous Organosilicate to Suppress Oxygen Ashing Damage", Electrochemical and Solid-State Letters, 5(3), G11-G14 (2002).
T.C. Chang, Y.S. Mor, P.T. Liu, T.M. Tsai, C.W. Chen, C.J. Chu, F. M. Pan, W. Lur and S.M. Sze, "Trimethylchlorosilane Treatment of Ultralow Dielectric Constant Material after Photoresist Removal Processing", J. Electrochem. Soc., 149(10), F145-F148 (2002).
T.C. Chang, Y.S. Mor, P.T. Liu, T.M. Tsai, C.W. Chen, Y.J. Mei and S.M. Sze, "Recovering Dielectric Loss of Low Dielectric Constant Organic Siloxane during the Photoresist Removal Process", J. Electrochem. Soc., 149(8), F81-F84 (2002).
Y.S. Mor, T. C. Chang, P.T. Liu, T.M. Tsai, C.W. Chen, S. T. Yan, C. J. Chu, W.F. Wu, F.M. Pan, W. Lur and S.M. Sze, "Effective repair to ultra-low-k dielectric material (k~2.0) by hexamethyldisilazane treatment", J. Vac. Sci. Technol. B 20(4), 1334-1338 (2002).
T.C. Chang, P.T. Liu, Y.S. Mor, T.M. Tsai, C.W. Chen, Y.J. Mei, F.M. Pan, W.F. Wu and S.M. Sze, "Eliminating dielectric degradation of low-k organosilicate glass by trimethylchlorosilane treatment", J. Vac. Sci Technol. B 20(4), 1561-1566 (2002).

* cited by examiner

*Primary Examiner*—Asok K. Sarkar
*Assistant Examiner*—Victor V. Yevsikov
(74) *Attorney, Agent, or Firm*—Kagan Binder, PLLC

(57) ABSTRACT

The present invention provides improvements to the use of silyating agents in semiconductor processing. More particularly, the silyating agents may be provided in combination with a substantially non-flammable ether, so that the combination is substantially non-flammable. Additionally, the silyating agent may be utilized in vapor form, or applied in conjunction with the electromagnetic radiation. Each of these embodiments can enhance the usability of the silyating agent, i.e., by rendering the silyating agent more safe, more easily utilized in a variety of processing equipment and/or by enhancing the passivation efficacy/efficiency of the silyating agent.

30 Claims, No Drawings

USE OF SILYATING AGENTS

This application claims the benefit of U.S. Provisional Application Ser. No. 60/489,414 filed Jul. 23, 2003, entitled "USE OF SILYATING AGENTS," which application is incorporated herein by reference in its entirety.

FIELD

The present invention relates to improvements to silyating agents and/or to improvements to methods of using these agents in the manufacture of semiconductor devices. More particularly, the present invention relates to compositions comprising the silyating agent and a non-flammable solvent. As such the composition is substantially non-flammable so as to be useable in applications where use of a vacuum can be impractical. Additionally, the silyating agent may be provided as a vapor, either alone or in conjunction with an inert carrier gas, thereby potentially reducing manufacturing time and space requirements. Furthermore, the silyating agent may applied in connection with the application of UV light, thereby enhancing the action of the silyating agent and resulting in greater surface hydrophobicity of a semiconductor device so treated.

BACKGROUND

Semiconductors are widely used to fabricate integrated circuits for electronic devices such as computers and televisions. These integrated circuits typically combine many transistors on a single crystal silicon chip to perform complex functions and store data. Semiconductor and electronics manufacturers, as well as end users, desire integrated circuits which can accomplish more in less time in a smaller package while consuming less power. One way of achieving such disparate desires can be to decrease the dielectric constant of the insulator, or dielectric, which separates conductors.

Probably the most common semiconductor dielectric is silicon dioxide, which has a dielectric constant ("k-value") of about 3.9. In contrast, air has a dielectric constant of about 1.0. Consequently, many strategies to lower the dielectric constant of dielectrics involve replacing portions of solid dielectrics with air by increasing the porosity of these materials. In order to obtain low dielectric constants in materials that are already highly porous, the number of hydroxyl groups in the structure may desirably be minimized, especially at pore surfaces. Without dehydroxylation in some form, the dielectric constant of porous silica or organosilicate films can exceed that of substantially non-porous, dense silica, i.e., hydroxylated porous silica or organosilicate films may have a dielectric constant as high as about 4.

Prior art attempts at dehydroxylation of porous silica and organosilicate films have focused on heating the films via application of thermal heat, and/or treatment of the films via one or more silyating agents. Porous silica and organosilicate materials need to be processed at very high temperatures, e.g., over 800° C. in order to be highly dehydroxylated. Many semiconductor devices, however, cannot tolerate such high heat, and dehydroxylation may thus typically be carried out at temperatures of only from about 350 to 400° C. As such, only partial dehydroxylation may be seen, and the desired dielectric constant may not be achieved. Also, many known silyating agents may exhibit limited effectiveness, or may require application in large amounts to provide maximum efficacy. Finally, many known silyating agents can be highly flammable, or even explosive, thereby requiring the use of special equipment and/or handling procedures in order to use these agents safely.

It would thus be desirable to provide a method for reducing the dielectric constant of porous silica materials that could yet be readily, easily and economically integrated into a manufacturing process for a silica containing semiconductor device. It would also be desirable to provide compositions comprising one or more silyating agents that could be less flammable than the silyating agent(s) alone, while yet retaining their effectiveness, or even a method of using known silyating agents in a fashion that enhances their effectiveness.

SUMMARY

In a first aspect then, the present invention provides an integrated method of reducing the dielectric constant of a dielectric film on a semiconductor substrate after post-ash residue removal using a silyating agent. Specifically, the silyating agent, e.g., hexamethyldisilazane (HMDS), would be brought into a process chamber of a semiconductor processing tool, such as the ZETA® Surface Conditioning System commercially available from FSI International, Chaska, Minn., in the vapor phase via nitrogen or other inert carrier gas. Using such a method, an "etched/ashed" porous MSQ film which is hydrophilic (e.g., having a water contact angle<10°) may be surface modified to be hydrophobic (e.g., to have a water contact angle $\geq 60°$) after being held in the vapor head of an HMDS liquid. Advantageously, the present inventive method can utilize lesser amounts of HMDS and yet achieve the desired contact angle (i.e., $\geq 60°$) and does not require the use of any liquid based co-solvents. In certain embodiments, the HMDS vapor dispense may be integrated into the nitrogen dry after post-ash residue removal processing. The proposed method could also be utilized for other silyating agents, e.g., trimethylchlorosilane (TMCS), or could be utilized in any other semiconductor tool, such as the ORION®) Dry Cleaning Module, and could be incorporated into semiconductor processes utilizing other vapor phase chemistries, where surface modification using hydrophobic functional groups would be advantageous.

In a further aspect of the invention, a substantially non-flammable silyating composition is provided comprising a silyating agent and an ether. More particularly, the present invention provides a composition comprising a silyating agent, e.g., HMDS, in combination with a substantially non-flammable solvent so that the composition has a flash point of at least about 60° C. Preferably, the non-flammable solvent is an ether, preferably a hydrofluoroether, and more preferably a segregated hydrofluoroether.

In yet another aspect, a method for reducing the dielectric constant of a dielectric material is provided comprising applying a silyating agent to the dielectric material in conjunction with electromagnetic radiation. Advantageously and desirably, the electromagnetic radiation, e.g., ultraviolet radiation, can be applied before, during, or after, introduction of the silyating agent and can be applied to any portion of the semiconductor substrate which contains the dielectric film. In certain embodiments, the method of the present invention may be integrated with another semiconductor processing step, so that silyating agent/UV application can occur in the same chamber as the other processing step, thereby leading to a reduction in cycle time.

DETAILED DESCRIPTION

The International Technology Roadmap for Semiconductors (ITRS 2001 Edition, published in 2001 by the Semiconductor Industry Association, http://public.itrs.net) differentiates between the dielectric constant of an as-deposited material and the effective dielectric constant of the material in a manufactured integrated device. The effective dielectric constant is larger than the as-deposited or bulk dielectric constant because current dual damascene integration schemes utilize a hard mask structure with a relatively large dielectric constant, e.g., $Si_xN_y$, $Si_xC_y$, $SiO_xC_y$, $SiO_xN_y$. The expected increase in dielectric constant is probably not due to processing, therefore, any increase in k-value due to etch, ash and residue removal processing would desirably be restored in order to meet the ITRS roadmap for advanced technology nodes.

It is readily accepted in the trade literature that the ash process can induce chemical and/or physical damage to the surface of the dielectric film (see for example, "Photostrip faces 300 mm, copper and low-k convergence" *Semiconductor International*, Vol. 23, No. 9, pg. 76-90 (2000). It is thought that this occurs through modification of hydrophobic functional groups, e.g., —$CH_x$, and damage to siloxane bonds to form hydroxyl species. The hydroxyl terminated surface is hydrophilic (contact angle<10°) and has a larger k-value compared to the as-deposited film.

The present invention provides methods that can reduce the dielectric constant of a dielectric film after post-ash residue removal and restore surface hydrophobicity, thereby passivating the surface of the dielectric film to moisture absorption via improvements to, and in the use of, known silyating agents. In certain embodiments of the invention, for example, the silyating agents may be provided in a composition further comprising a substantially non-flammable ether, wherein the composition desirably has a flashpoint greater than at least about 60° C. In these embodiments of the invention, the composition may advantageously be applied in the absence of a vacuum, if desired, while not posing the safety concerns that may be present in the application of known silyating agents alone. In other embodiments of the invention, the silyating agent may be provided in the form of a vapor, thereby lessening the amount of the silyating agent that may be required to achieve a desired reduction in dielectric constant of the dielectric film and/or providing greater flexibility in tools that may be used to apply the silyating agent. Finally, in certain embodiments, the silyating agent, whether alone or as a part of a composition comprising a substantially non-flammable ether, or whether applied as a liquid or a vapor, may be applied to a dielectric film on a semiconductor substrate in conjunction with the irradiation of the film and substrate with electromagnetic radiation. In addition to providing the convenience of being useable in a one-tool method, this embodiment of the invention further provides a greater degree of hydrophobocity to the dielectric film so treated. Each of the disclosed methods could be used alone or in combination with any other semiconductor processes where surface modification using hydrophobic functional groups would be advantageous or desirable.

Silyating agents expected to be useful in the present methods include, but are not limited to, chlorosilanes, alkylsilanols, arylsilanols, disiloxanes, alkyloxysilanes, alkylacetyloxysilanes or arylacetoxysilanes. Particular examples of these include, but are not limited to, acetoxytrimethylsilane, acetoxysilane, diacetoxydimethylsilane, methyltriacetoxysilane, phenyltriacetoxysilane, diphenyldiacetoxysilane, trimethylethoxysilane, trimethylmethoxysilane, 2-trimethylsiloxypent-2-ene-4-one, n-(trimethylsilyl)acetamide, 2-(trimethylsilyl)acetic acid, n-(trimethylsilyl)imidazole, trimethylsilylpropiolate, trimethylsilyl(trimethylsiloxy)-acetate, nonamethyltrisilazane, hexamethyldisilazane, hexamethyldisiloxane, hexamethyldisilane, trimethylsilanol, triethylsilanol, triphenylsilanol, t-butyidimethylsilanol, diphenylsilanediol, trimethylchlorosilane, methyltrichlorosilane, and combinations of these. One example of a preferred silyating agent is hexadimethyldisilazane, or HMDS.

In those embodiments of the invention wherein the silyating agent is provided in a composition further comprising a substantially non-flammable ether, one example of a method of applying the composition to a dielectric film on a semiconductor substrate in order to improve (decrease) the dielectric constant of the film and passivate the film to moisture absorption may include the following steps:

1. Following the post-ash residue removal process, the dielectric film on a semiconductor substrate may be sprayed with, or immersed within, a silyating agent, e.g., hexamethyldisilazane (HMDS) at a 1% dilution diluted in a co-solvent comprising a substantially non flammable ether, e.g., a hydrofluoroether (such as that commercially available under the trade designation HFE-7100DL from 3M, Maplewood Minn.) at room temperature for 1 minute.
2. The film/substrate may then be substantially dried with an inert gas, such as nitrogen, helium, and the like.
3. The film/substrate may then be heated to about 400-425° C. for from about 30 to about 60 minutes.

FTIR spectroscopic analysis of a dielectric film so treated supports the theory that the HMDS reacts with isolated or "free" surface hydroxyl groups to form a trimethyl-siloxy group which renders the surface of the treated dielectric film hydrophobic (e.g., provides the substrate with a contact angle of greater than about 90°). All hydroxyl groups may not react because the trimethyl siloxy group is relatively large and steric hindrance prevents full surface coverage. Subsequent heating above 400° C. facilitates moisture desorption and neighboring hydroxyl conversion to siloxane via a condensation reaction.

Solutions with from about 1% by weight to about 20% by weight silyating agent in solution with a substantially non-flammable ether are expected to have a flashpoint of greater than about 60° C. and as such, are expected to be useful in a wide variety of semiconductor processing tools or chambers, and in particular are useable in all wet chemical systems currently commercially available from FSI International. Any non-flammable ether can be utilized to provide a composition for use in the inventive method. Desirably, the non-flammable ether will be one capable of, when provided in combination with the silyating agent, providing the overall composition with a flashpoint of at least about 60° C. Ethers expected of being capable of providing such a composition include, but are not limited to, e.g., hydrofluoroethers, isopropyl ether or dibutyl ether. Of these, hydrofluoroethers are preferred and segregated hydrofluoroethers are particularly preferred. Segregated hydrofluoroethers are described, e.g., in Kehren J., "A Comparison of Hydrofluoroether and Other Alternative Solvent Cleaning Systems", available on-line at http://www.semiconductorfabtech.com/datatech/journals/edition6/downloads/dt6_53_56.pdf, the entire disclosure of which is incorporated herein by reference for all purposes. Commercially available examples of segregated fluoroethers, as well as azeotropes including segregated hydrofluoroethers appropriate for use in the present inventive methods include, but are not limited to, those available under the trade designations HFE-7100DL, HFE-7100, HFE-2200, HFE-7200DL, HFE-7500, HFE-711PA, HFE-71DE, HFE-71DA, HFE-71D90 from 3M Company, Maplewood, Minn.

Those embodiments of the present invention wherein the silyating agent is used in combination with a non-flammable ether provide significant advantages over methods of passivating dielectric surfaces using known silyating agents alone.

More particularly, while the silyating agent/ether combination can retain its effectiveness to reduce the dielectric constant of the dielectric film treated with the same, the combination is substantially less flammable than known silyating agents used alone. As such, the silyating agent/ether combination may be applied in any wet chemical processing system, regardless of whether such system is capable of placing the treatment chamber under vacuum, and in particular, may be utilized in any of the wet chemistry systems commercially available from FSI International. The use of the silyating agent/ether combination in such systems is expected to facilitate increased queue times between residue removal and subsequent film deposition process steps for moisture-sensitive materials.

In other embodiments of the invention, the silyating agent may be provided in the form of a vapor, thereby lessening the amount of the silyating agent that may be required to achieve a desired reduction in dielectric constant of the substrate and/or providing greater flexibility in tools that may be used to apply the silyating agent. These embodiments of the invention also do not require the use of liquid co-solvents, and as such, may be desirable in applications where the use of such solvents is contraindicated. More particularly, the silyating agent, e.g., HMDS, may be brought into a process chamber in the vapor phase via nitrogen or other inert carrier gas. An "etched/ashed" porous MSQ film which is hydrophilic (e.g., having a water contact angle of less than about 10°) may be surface modified to hydrophobic (e.g., having a water contact angle of at least about 60°) when held in the process chamber in the presence of the HMDS vapor. Advantageously, in these embodiments of the invention, the HMDS treatment may be integrated into another processing step, e.g., a nitrogen dry after post-ash residue removal, thereby potentially reducing cycle time. One example of a method of applying a vaporized silyating agent to a dielectric film on a semiconductor substrate in order to passivate the substrate to moisture absorption may include the following steps:

1. Remove post-ash residue from a dielectric film on a semiconductor substrate, e.g., a wafer, using a chemical formulation dispensed in the FSI ZETA® Surface Conditioning System.
2. Rinse the wafer with deionized water to remove chemical formulation.
3. Dry the wafer with nitrogen gas.
4. Expose the wafer to HMDS vapor (or other silyating agent, e.g., trimethylchlorosilane (TMCS)) in nitrogen or other inert carrier gas.

The silyating agent may be provided in vapor form utilizing any known method of doing so. As used herein, the term 'vapor' is meant to include at least the following physical forms and/or delivery methods: gas form, a gas in a carrier gas, an aerosol, or an aerosol in a carrier gas. In preferred embodiments, the silyating agent will be provided as a gas (with or without a carrier gas). One exemplarily method of providing the silyating agent in vapor form is described in co-pending and co-owned patent application Ser. No. 10/608,894, entitled "Improved Microelectronic Device Drying Devices and Techniques", filed Jun. 27, 2003, the entire disclosure of which is incorporated by reference herein for all purposes.

In yet other embodiments of the invention, the silyating agent, whether alone or as a part of a composition comprising a substantially non-flammable ether, or whether applied as a liquid or a vapor, may be applied to a dielectric film on a semiconductor substrate in conjunction with the irradiation of the film and/or substrate with electromagnetic radiation. In addition to providing the convenience of being useable in a one-tool method, this embodiment of the invention may also provide a greater degree of hydrophobocity to the dielectric film so treated. Any source and type of electromagnetic radiation may be employed, desirably the chosen source and type will be capable of being integrated into a semiconductor processing tool. Further, the electromagnetic radiation may be applied simultaneously, sequentially or in overlapping fashion with the silyating agent and may be applied to any portion of the dielectric film or semiconductor substrate regardless of where the silyating agent is to be applied. UV radiation is preferred, as it has been shown to provide enhanced hydrophobicity in shorter periods of time when utilized in the present inventive methods. Advantageously, the silyating agent/UV radiation treatment may be carried out in a single semiconductor treatment chamber, thereby reducing cycle time. One example of a method of applying a silyating agent in combination with UV radiation to a dielectric film or a semiconductor substrate in order to passivate the film to moisture absorption may include the following steps:

1. Subject a dielectric film on a semiconductor substrate to a post-ash residue removal process in either a spray or immersion semiconductor processing tool.
2. Using ORION® Dry Cleaning Module, commercially available from FSI International, expose the film/substrate to silyating agent vapor, e.g., HMDS vapor as may be provided as discussed herein above, with or without broad-band UV with power in the range of 340 to 1400 watts. The silyating agent can also be diluted with 4% $H_2$ in He gas. Process time is 30 seconds.
3. Using ORION® Dry Cleaning Module, expose the modified film/substrate to 1400 watts of broad-band UV with or without 4% $H_2$ in He gas. Process time is 30 to 90 seconds.

A further example of a method of applying a combination of a silyating agent and UV radiation to a dielectric film on a semiconductor substrate of the film may proceed as follows:

1. Subject a dielectric film on a semiconductor substrate to a post-ash residue removal process in either a spray or immersion semiconductor processing tool, such as any of those commercially available from FSI International.
2. Using for example, the ORION® Dry Cleaning Module commercially available from FSI International, expose the film/substrate to 100% HMDS vapor with broad-band UV illumination with power at about 700 watts on the low dielectric constant side of the semiconductor.
3. Using for example, the ORION® Dry Cleaning Module commercially available from FSI International, expose the HMDS-modified film/substrate to 1400 watts of broad-band UV illumination on each side of the substrate simultaneously for at least about 90 seconds.

The following published patent applications, patents or technical documents describe low-K materials, processing thereof, and methods for repair or restoration of low-K after such processing. Each of these is hereby incorporated herein in its entirety by reference for all purposes: U.S. Pat. Nos. 5,847,443; 6,140,252; 6,383,466; 6,395,651; 6,417,118; 6,495,906; 6,531,755; 6,537,928; 6,548,113; 2001/0034076; 2002/0100419; 2002/0123236; 2002/0123242; 2003/0008518; P-T Liu, T. C. Chang, Y. S. Mor, C. W. Chen, T. M. Tsai, C. J. Chu, F. M. Pan and S. M. Sze, "Effective strategy for porous organosilicate to suppress oxygen ashing damage", Electrochemical and Solid-State Letters, 5(3), G1-G14 (2002); T. C. Chang, Y. S. Mor, P. T. Liu, T. M. Tsai, C. W. Chen, C. J. Chu, F. M. Pan, W. Lur and S. M. Sze, "Trimethylchlorosilane treatment of ultralow dielectric constant material after photoresist removal processing", J. Electrochem. Soc., 149(10), F145-F148 (2002); T. C. Chang, Y. S. Mor, P.

T. Liu, T. M. Tsai, C. W. Chen, Y. J. Mei and S. M. Sze, "Recovering dielectric loss of low dielectric constant organic siloxane during the photoresist removal process", J. Electrochem. Soc., 149(8), F81-F84 (2002); Y. S. Mor, T. C. Chang, P. T. Liu, T. M. Tsai, C. W. Chen, S. T. Yan, C. J. Chu, W. F. Wu, F. M. Pan, W. Lur and S. M. Sze, "Effective repair to ultra-low-k dielectric material (k~2.0) by hexamethyldisilazane treatment", J. Vac. Sci. Technol. B 20(4), 1334-1338 (2002); T. C. Chang, P. T. Liu, Y. S. Mor, T. M. Tsai, C. W. Chen, Y. J. Mei, F. M. Pan, W. F. Wu and S. M. Sze, "Eliminating dielectric degradation of low-k organosilicate glass by trimethylchlorosilane treatment", J. Vac. Sci. Technol. B 20(4), 1561-1566 (2002).

EXAMPLE 1

Passivation of a Silicon Wafer Comprising a Post-Ashed Porous—MSQ Film Via Application of a Composition Comprising a Silyating Agent and a Substantially Non-Flammable Ether 1. The water contact angle of a 2 cm×2 cm silicon wafer chip with a 250 nm "ashed" porous MSQ film was <10° as determined by placing a small drop of water onto the wafer chip and measuring the contact angle with a goniometer.
2. In a 250 mL beaker, a solution consisting of 1.54 g of HMDS (volume=2 mL) and 150 g of HFE-7100DL (volume=100 mL) was prepared yielding a 1% by weight solution. The beaker was placed on a magnetic stirrer plate and a magnetic stirrer was placed in solution and rotated at 300 rpm.
3. One 2 cm×2 cm silicon wafer chip with a 250 nm-thick "ashed" porous MSQ film was placed in the 250 mL beaker with the HMDS/HFE solution for 1 minute.
4. The water contact angle of the 1% by weight HMDS in HFE-7100DL treated wafer chip was 85° as determined by placing a small drop of water onto the wafer chip and measuring the contact angle with a goniometer.

EXAMPLE 2

Passivation of a Silicon Wafer Comprising a Post-Ashed Porous MSQ Film Via Application of a Vapor Comprising a Silyating Agent and an Inert Carrier Gas Under Ambient Pressure 1. A semiconductor substrate (wafer) with an ashed porous MSQ film with a water contact angle of 10° or less will be placed in a wafer carrier which in turn will be placed on a rotatable turntable in the ZETA® Surface Conditioning System, commercially available from FSI International.
2. The wafer carrier will be rotated at 300 rpm.
3. A vapor mixture of ≦5% HMDS in a nitrogen carrier gas will be flowed into the exhausted process bowl containing the spinning wafers for 5 minutes.
4. This process is expected to passivate the film on the wafers so treated to moisture absorption, i.e., the treated films are expected to have a water contact angle greater than or equal to 60° as measured by a goniometer.

EXAMPLE 3

Passivation of a Silicon Wafer Comprising a Post-Ashed Porous MSQ Film Deposited Via Application of a Silyating Agent Vapor and UV Radiation Under Vacuum 1. A semiconductor substrate (wafer) with an ashed porous MSQ film with a water contact angle of 10° or less as measured using a goniometer was placed in the ORION® Dry Cleaning Module and the process chamber evacuated to 0 torr.
2. HMDS liquid was placed into a canister and connected to a mass flow controller which in turn was connected to the ORION® Dry Cleaning Module. The HMDS was heated to 65° C. to generate the HMDS vapor.
3. The HMDS vapor was flowed at a flow rate of 100 sccm into the process chamber containing the wafer for 30 seconds. The chamber pressure was regulated to 3 torr during HMDS exposure.
4. The HMDS was evacuated from the process chamber.
5. 4% $H_2$ in He was flowed at 100 sccm into the process chamber containing the wafer while controlling the chamber pressure at 0 torr. Two broad band (100-1000 nm) UV lamps were then powered independently to 1400 W and one lamp directed at the front surface of the wafer and one lamp directed at the back surface of the wafer for 90 seconds.
6. This process modified the hydrophilic "ashed" porous MSQ film to hydrophobic yielding a water contact angle of 74° as measured by a goniometer.

EXAMPLE 4

Passivation of a Silicon Wafer Comprising a Post-Ashed Porous MSQ Film Deposited Thereon Via Application of a Silyating Agent Vapor and UV Radiation Under Vacuum 1. A semiconductor substrate (wafer) with an ashed porous MSQ film with a water contact angle of 10° or less as measured using a goniometer was placed in the ORION® Dry Cleaning Module and the process chamber evacuated to 0 torr.
2. HMDS liquid was placed into a canister and connected to a mass flow controller which in turn was connected to the ORION® Dry Cleaning Module. The HMDS was heated to 65° C. to generate the HMDS vapor.
3. The HMDS vapor was flowed at 100 sccm into the process chamber containing the hydrophilic wafer for 30 seconds with the UV broad band (100-1000 nm) radiation on at a power of 700 W. The chamber pressure was regulated to 3 torr during HMDS exposure.
4. The HMDS was then evacuated from the process chamber.
5. 4% $H_2$ in He was flowed at 100 sccm into the process chamber containing the wafer while controlling the chamber pressure at 0 torr. Two broad band (100-1000 nm) UV lamps were then powered independently to 1400 W and one lamp directed at the front surface of the wafer and one lamp directed at the back surface of the wafer for 90 seconds.
6. This process modified the hydrophilic "ashed" porous MSQ film to hydrophobic yielding a water contact angle of 87° as measured by a goniometer.

What is claimed is:

1. A method of passivating a semiconductor substrate comprising a dielectric film to moisture absorption comprising:
   processing the dielectric film of the substrate in manner that causes the dielectric constant of the dielectric film to increase; and
   after said processing, exposing the dielectric film of the substrate to a composition in a manner so as to reduce the dielectric constant of the dielectric film, wherein the composition comprises at least one silyating agent and at least one substantially non-flammable ether.

2. The method of claim 1, wherein the substrate is exposed to the composition at ambient pressure.

3. The method of claim 1, wherein the silyating agent is hexamethyldisilazane.

4. The method of claim 1, wherein said processing comprises the step of treating the substrate with a post-ash residue removal composition in a manner so as to expose the dielectric film.

5. The method of claim 1, wherein the ether comprises a hydrofluoroether.

6. The method of claim 5, wherein the hydrofluoroether comprises a segregated hydrofluoroether.

7. A method of passivating a semiconductor substrate comprising a dielectric film to moisture absorption comprising:
   processing the dielectric film of the substrate in manner that causes the dielectric constant of the dielectric film to increase; and
   after said processing, exposing the dielectric film of the substrate to a vapor in a manner so as to reduce the dielectric constant of the dielectric film, wherein the vapor comprises at least one silyating agent and at least one substantially non-flammable ether.

8. The method of claim 7 wherein the vapor further comprises an inert carrier gas.

9. The method of claim 7, further comprising the step of exposing the substrate to electromagnetic radiation.

10. The method of claim 9, wherein the electromagnetic radiation comprises broadband ultraviolet radiation.

11. The method of claim 10, wherein the ultraviolet radiation is applied to the substrate substantially simultaneously with the at least one silyating agent and at least one substantially non-flammable ether.

12. The method of claim 10, wherein the ultraviolet radiation is applied to the substrate sequentially with respect to the at least one silyating agent and at least one substantially non-flammable ether.

13. The method of claim 10, wherein the ultraviolet radiation is applied to the substrate in an overlapping fashion with respect to the at least one silyating agent and at least one substantially non-flammable ether.

14. The method of claim 7, wherein said processing comprises the step of exposing the substrate to a post-ash residue removal composition in a manner so as to expose the dielectric film.

15. The method of claim 1, wherein the ether comprises a hydrofluoroether.

16. The method of claim 15, wherein the hydrofluroether comprises a segregated hydrofluoroether.

17. A method of passivating a semiconductor substrate comprising a dielectric film having an upper and a lower surface to moisture absorption comprising:
   processing the dielectric film of the substrate in manner that causes the dielectric constant of the dielectric film to increase; and
   after said processing, performing the steps comprising:
      exposing the dielectric film of the substrate to at least one silyating agent; and
      exposing the substrate to broadband ultraviolet radiation, wherein said exposing steps are performed in a manner so as to reduce the dielectric constant of the dielectric film.

18. The method of claim 17, wherein the at least one silyating agent comprises hexamethyldisilazane.

19. The method of claim 18, wherein the hexamethyldisilazane is provided as a fluid composition.

20. The method of claim 19, wherein the fluid composition further comprises a substantially non-flammable ether.

21. The method of claim 20, wherein the substantially non-flammable ether comprises a segregated hydrofluoroether.

22. The method of claim 17, wherein the substrate is exposed to broadband ultraviolet radiation via an ultraviolet lamp.

23. The method of claim 17, wherein the broadband ultraviolet radiation is caused to be incident upon the upper surface of the semiconductor substrate.

24. The method of claim 17, wherein the broadband ultraviolet radiation is caused to be incident upon the lower surface of the semiconductor substrate.

25. The method of claim 17, wherein said processing comprises the step of exposing the substrate to a post-ash residue removal composition in a manner so as to expose the dielectric film.

26. A single processing chamber method for passivating a semiconductor substrate comprising a dielectric film to moisture absorption following a residue removal step comprising:
   placing the substrate within the processing chamber, wherein while the substrate is positioned in the processing chamber performing steps comprising;
   a first exposing step comprising exposing at least a portion of the substrate to a residue removal composition in a manner so as to expose the dielectric film, wherein the dielectric film has an increased dielectric constant due to processing; and
   after said first exposing a second exposing step comprising exposing at least a portion of the dielectric film of the substrate to a silvating composition comprising at least one silyating agent in a manner so as to reduce the dielectric constant of the dielectric film.

27. The method of claim 26, wherein the contact angle of the dielectric film is less than about 10° after being exposed to the residue removal composition.

28. The method of claim 27, wherein the contact angle of the dielectric film is at least about 60° after being exposed to the at least one silyating agent.

29. The method of claim 26, further comprising the step of exposing at least a portion of the substrate to electromagnetic radiation within the processing chamber.

30. The method of claim 26, wherein the silyating composition further comprises at least one substantially non-flammable ether.

* * * * *

UNITED STATES PATENT AND TRADEMARK OFFICE
CERTIFICATE OF CORRECTION

PATENT NO. : 7,425,505 B2  
APPLICATION NO. : 10/894319  
DATED : September 16, 2008  
INVENTOR(S) : Clark et al.

Page 1 of 1

It is certified that error appears in the above-identified patent and that said Letters Patent is hereby corrected as shown below:

Column 9, Line 58
"hydrofluroether" should be --hydrofluoroether--.

Column 10, Line 46
"silvating" should be --silyating--.

Signed and Sealed this

Second Day of December, 2008

JON W. DUDAS  
*Director of the United States Patent and Trademark Office*